United States Patent [19]

Yokogawa et al.

[11] Patent Number: 4,929,917
[45] Date of Patent: May 29, 1990

[54] PHASE-LOCKED LOOP CIRCUIT

[75] Inventors: Fumihiko Yokogawa, Saitama; Ryuichi Naito, Tokorozawa, both of Japan

[73] Assignee: Pioneer Electronic Corporation, Tokyo, Japan

[21] Appl. No.: 288,575

[22] Filed: Dec. 22, 1988

[30] Foreign Application Priority Data

Jul. 15, 1988 [JP] Japan ................... 63-176651

[51] Int. Cl.$^5$ ................. H03L 7/08; G11B 5/02
[52] U.S. Cl. .......................... 331/1 A; 331/15; 331/17; 331/25; 360/27; 369/47
[58] Field of Search .............. 331/1 A, 15, 17, 18, 331/25, 27; 375/120; 360/27, 28, 36.2, 37.1

[56] References Cited

U.S. PATENT DOCUMENTS 4,596,963 6/1986 Lawton et al. .................. 331/14
4,617,527 10/1986 Naitoh .......................... 331/17 X Primary Examiner—David Mis
Attorney, Agent, or Firm—Wagner & Bretschneider

[57] ABSTRACT

A phase-locked loop circuit (PLL) to which a phase-synchronization signal is intermittently supplied, both of the natural angular frequency of the PLL and the damping factor of the same are so determined as to prevent a phase difference produced at the next sampling point from exceeding the linear property range of a phase comparator even when the extraneous electrical disturbance enters the PLL. In addition, when the level of a clock control signal supplied to a variable frequency oscillator which varies the clock signal of the PLL in phase and frequency exceeds a predetermined value, the level of the clock control signal is limited to the predetermined value. As a result, it is possible to prevent the output signal of the phase difference from having any discontinuity.

5 Claims, 7 Drawing Sheets

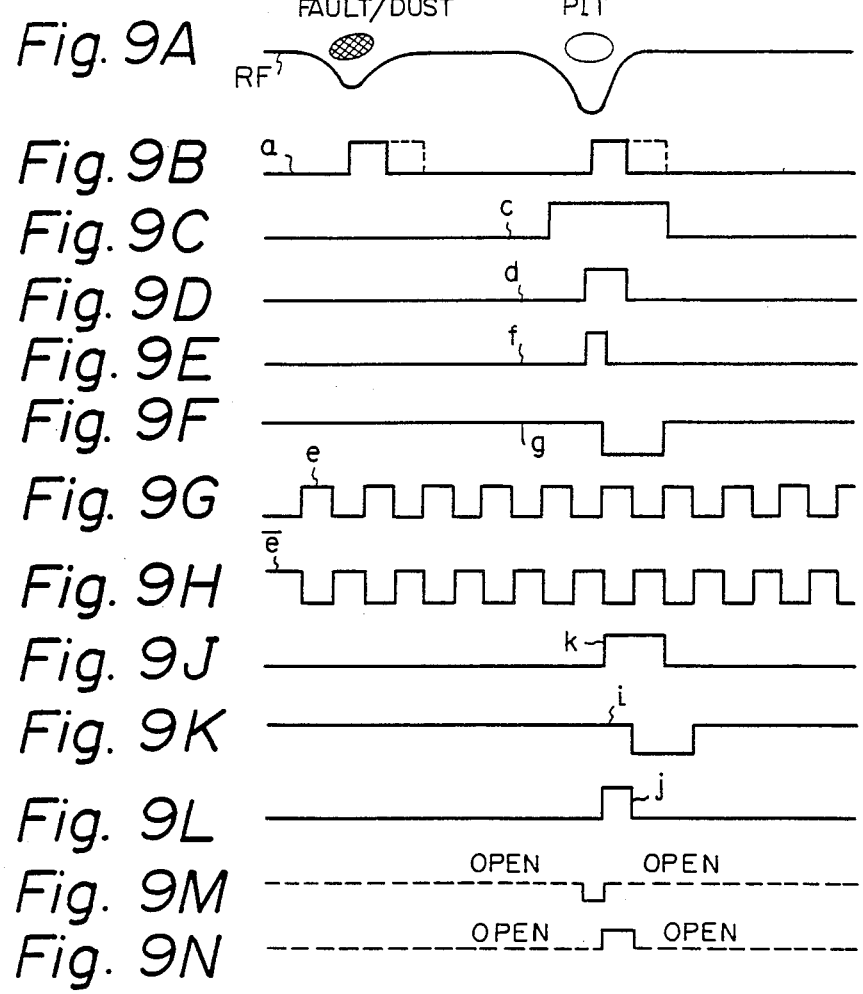

Fig. 12A
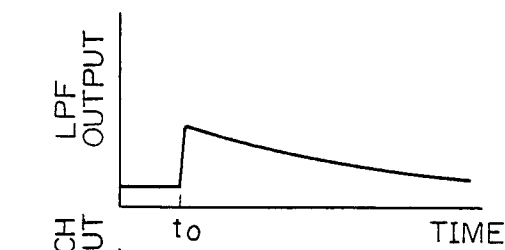
Fig. 12B
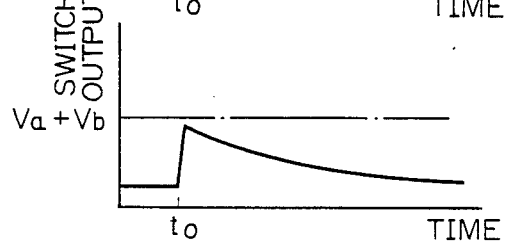
Fig. 12C
Fig. 12D
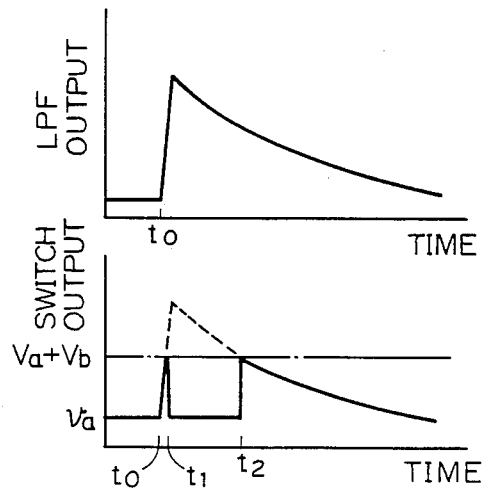
Fig. 12E
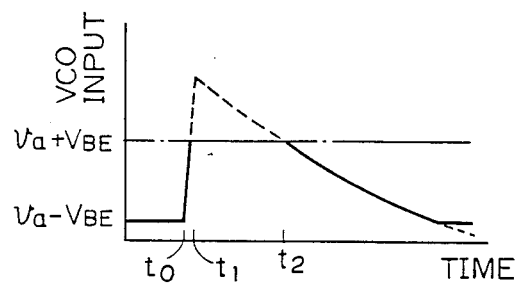

PHASE-LOCKED LOOP CIRCUIT

BACKGROUND OF THE INVENTION

1. Field of the Invention

The present invention relates to a phase-locked loop circuit, and more particularly to a phase-locked loop circuit incorporated in a clock-signal generator which is used for recording and reproducing data under the so-called sampled servo format system.

2. Description of the Prior Art

As shown in FIG. 1, the so-called servo regions i.e. pre-pit regions are previously formed along the respective track centers on an optical disc such as magneto-optical disc and DRAW (Direct Read After Write) disc. Each sector defined by the servo regions consists of 43 servo blocks each of which is composed of 2 servo bytes and 16 data bytes following to the servo bytes. Each of the servo bytes consists of: one pair of wobbled pits disposed in an offset manner with respect to the track center of the optical disc; and one clock pit following to the wobbled pits. In case that a data-detecting optical spot beam emitted from a pickup device of an optical disc recording/reproducing apparatus stays at the track center of the optical disc, there is no difference in light-volume of the light beams reflected at the wobbled pits. In contrast, in case that the data-detecting optical spot beam deviates from the track center of the optical disc, there appear some difference in the light-volume of the reflected beams at the pair of the wobbled pits, which difference depends on the direction and largeness of the deviation of the spot beam with respect to the track center. Consequently, a tracking error signal is produced in response to the difference of the light-volume reduction of the reflected light beam at the pair of the wobbled pits, which difference corresponds to a level difference in RF signal. The tracking error signal is kept during a scanning period of the data bytes following to the servo bytes.

The wobbled pits are spaced apart from each other by a predetermined circumferential distance along the track center, the circumferential distance being alternately increased and decreased at intervals of 16 tracks to make it possible to precisely count the number of tracks having been fast searched by detecting a difference in the circumferential distance. In this case, 16-track counting is conducted.

A trailing one of the pair of the wobbled pits is spaced apart from a clock pit in each of the servo bytes by a specific distance "D" which does not appear in the data bytes to make it possible to employ the specific distance "D" as a synchronizing signal. On the basis of the synchronizing signal having been detected, various kinds of timing signals are produced. The mirror surface area of the distance D, which is disposed in a position between the trailing one of the pair of the wobbles pits and the clock pit functions as a focus area usable for obtaining a focus-error signal, the focus-error signal being kept during a period of time for reading the data bytes following to the servo bytes.

In case that a 5-inch DRAW disc on which the servo bytes described above are prerecorded is rotated at a speed of, for example 1800 rpm, the clock pits produce an RF signal with signal edges appearing at repetition frequency of 41.28 KHz.

In the DRAW disc carrying the above-mentioned pre-pit regions, the data bytes are recorded in an area following to the area of the prerecorded servo bytes. Such data bytes having been recorded on the DRAW disc are reproduced by using a clock signal generated in a clock generator circuit shown in FIG. 2.

In FIG. 2, the RF signal derived from an optical disc (not shown) through a pickup device 1 is amplified through a head amplifier 2, and then supplied to a differentiating and edge detection circuit 3 which differentiates the RF signal and to detect an edge of the differentiated RF signal, so that the circuit 3 issues edge pulses "a" forming a pulse train as seen from FIG. 4A. The edge pulses "a" issued from the differentiating and edge detecting circuit 3 are supplied to a synchronization detector circuit 4 and to one of a pair of input terminals of an AND gate 5 simultaneously. On the other hand, a phase-locked loop circuit 6 issues a regenerative clock pulse "e" to the synchronization detector circuit 4 in which an interval between adjacent ones of the edge pulses "a" are measured by counting the regenerative clock pulses "e". When the thus measured value of the interval reaches a predetermined value, the synchronization detector circuit 4 issues a synchronization-detecting signal "b" to a gate pulse generator circuit 7 which is so constructed as to issue a clock gate pulse "c" with a predetermined pulse width upon the lapse of a predetermined period of time from when the synchronization-detecting signal "b" is issued to the circuit 7 in response to the regenerative clock pulse "e" issued from the phase-locked loop circuit 6. The clock gate pulse "c" issued from the gate pulse generator circuit 7 is supplied to the other of the pair of the input terminals of the AND gate 5, the other of the input terminals serving as a data-reading window.

As a result, the AND gate 5 issues an output signal to a phase comparator circuit 8 of the phase-locked loop circuit 6. In the phase comparator circuit 8, the edge pulse "a" corresponding to the clock pit having been extracted in the AND gate 5 is compared in phase with the regenerative clock pulse "e" to produce an output signal which is supplied to a low-pass filter (LPF) 10.

The low-pass filter (LPF) 10 has a construction as shown in FIG. 3, i.e., the LPF 10 is comprised of: resistors $R_1$, $R_2$ and $R_3$; capacitors $C_1$ and $C_2$; and an operational amplifier.

The low-pass filter (LPF) 10 smoothes the above output signal and issues the thus smoothed output signal as a control signal voltage to a voltage-controlled oscillator (VCO) 11 which in turn issues a regenerative clock pulse signal "e" having a frequency of for example 11.1456 MHz, which pulse signal "e" corresponds to the control signal voltage in phase. The regenerative clock pulse signal "e" thus produced is then supplied to the phase comparator 8.

In the phase-locked loop circuit (PLL) 6 of the present invention having the above-mentioned construction, the level of the RF signal is decreased upon the passage of an area of a pit of the detecting spot when the optical spot beam emitted from the pickup device 1 scans the servo bytes of the optical disc. Consequently, as shown in FIG. 4A, the differentiating and edge detector circuit 3 issues the edge pulse "a" at a time when the optical spot beam scans a pit on the optical disc. When the interval of the adjacent edge pulses "a" coincides in length with the distance "D", the synchronization detector circuit 4 issues the synchronization-detecting signal "b". In response to such synchronization-detecting signal "b", the gate pulse generator circuit 7 issues the gate pulse "c" such as shown in FIG. 4B, which gate pulse "c" gates the clock edge pulse "d" corresponding to the clock pits of the optical disc. Both of the edge pulse "a" and the gate pulse "c" are supplied to the AND gate 5 to make it possible that the AND gate 5 serves as a reading window, whereby as shown in FIG. 4C only the clock edge pulse "d" is separated and supplied to the phase comparator circuit 8 of the phase-locked loop circuit 6, which clock edge pulse "d" serves as a phase sampling pulse corresponding to the clock pit of the optical disc.

As a result, the regenerative clock pulse "e" synchronized with the clock edge pulse "d" is produced in the phase-locked loop circuit (PLL) 6.

In general, noises caused by faults appearing in the optical disc and its clock pits cause some extraneous electrical disturbance to enter the phase-locked loop circuit (PLL) 6. In case that the regenerative clock pulse "e" varies in phase under the influence of such extraneous electrical disturbance, i.e., for example, in case that a clock pulse such as an input clock pulse P2 which has its time base varied and makes its phase to be outside of a linear property range $\pm \alpha$, for example, $-\pi$ to $+\pi$ of a phase comparator is supplied to the phase comparator an output signal of which periodically linearly increases with respect to a phase difference "$\phi$" as shown in FIG. 5, the phase-locked loop circuit for canceling the phase difference component can not correctly operate nor perform the rapid convergence to the stable operation. The linear property range means a range in which a linear relation between input and output signals is kept, in this specification.

As far as a delay of the input clock pulse is within the linear phase reference range $\pm \alpha$, that is, the reference input clock pulse appears at such a time position as shown by a phantom line P$_1$ as shown in FIG. 5, the phase comparator circuit 8 issues a voltage "A" volts to cancel the extraneous electrical disturbance entered the phase-locked loop circuit (PLL) 6. On the other hand, in case that the input clock pulse appears outside of the linear phase reference range, for example, at such a position as shown by a phantom line P$_2$, the phase comparator circuit 8 issues a voltage "B" volts which causes a voltage-controlled oscillator circuit (VCO) 11 to disadvantageously operate so as to increase the extraneous electrical disturbance.

On the other hand, a window width $\pm \beta$ of the data-reading window for extracting the clock edge pulse is identical with $\pm \pi$ in theory in case of no jitter. However, in actual case, since there is some jitter caused by a condition of eccentricity of the optical disc and a decrease in C/N, the window width $\pm \beta$ of the data-reading window is smaller than the above-mentioned value $\pm \pi$. It is also necessary to position the regenerative clock pulse "e" within the window width $\pm \beta$ of the data-reading window, the regenerative clock pulse "e" being deviated in phase under the influence of the extraneous electrical disturbance.

SUMMARY OF THE INVENTION

It is an object of the present invention to provide a phase-locked loop circuit (PLL) which can stand against the extraneous electrical disturbance.

According to one aspect of the present invention there is provided a phase-locked loop circuit (PLL) comprising: comparator means having a linear property range of $\pm \alpha$ and issuing a clock control signal a level of which depends on a phase difference between a clock signal and a phase sample pulse which is extracted at a sampling period generally equal to a time period T$_s$; and variable frequency oscillator means for producing said clock signal while changing the frequency of the clock signal in response to said level of said clock control signal, the product of the natural angular frequency of said phase-locked loop circuit (PLL) and a damping factor thereof is defined as follows:

$$|\omega_n \cdot \zeta \leq \alpha/2\pi \cdot T_s|$$

wherein $\omega_n$ is said natural angular frequency, and $\zeta$ is said damping factor.

According to another aspect of the present invention, there is provided a phase-locked loop circuit (PLL) comprising: comparator means having a predetermined linear property range and issuing a clock control signal a level of which depends on a phase difference between a clock signal and a phase sampling pulse which is extracted at a predetermined sampling period; and variable frequency oscillator means for producing said clock signal while changing the frequency of the clock signal in response to said level of said clock control signal, the phase-locked loop circuit (PLL) further comprises level limiter means for preventing said level of said clock control signal from exceeding a predetermined value.

BRIEF DESCRIPTION OF THE DRAWINGS

FIGS. 9A through 9N are diagrams illustrating waveforms of signals appearing in the phase comparator circuit of FIG. 8;

FIGS. 12A, 12B, 12C, 12D and 12E are graphs illustrating output and input characteristics of various circuit components of the circuit arrangement shown in FIG. 10.

DESCRIPTION OF THE PREFERRED EMBODIMENTS

Figure 1:
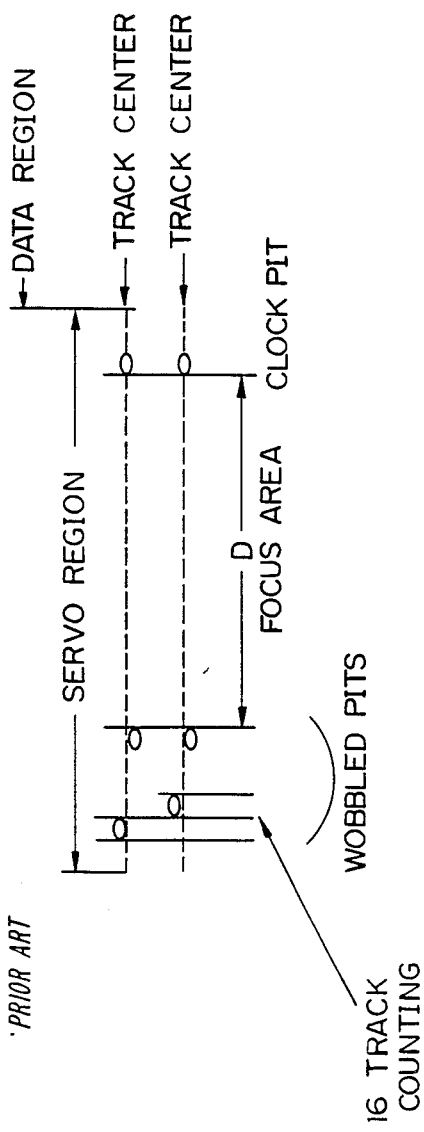
FIG. 1 is a partially enlarged plan view of the optical disc for illustrating the sampled format system employed in the present invention.
Figure 3:
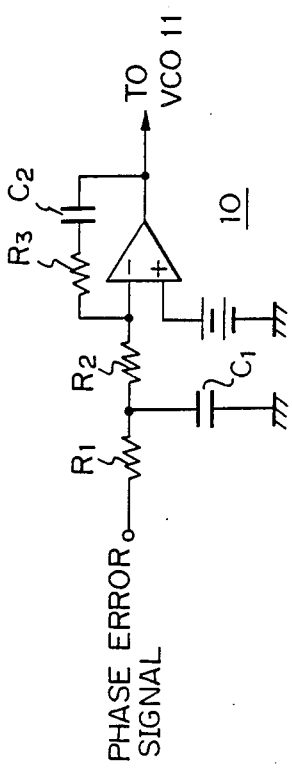
FIG. 3 is a circuit diagram of the low-pass filter 10 employed in the conventional phase-locked loop circuit (PLL)
Figure 2:
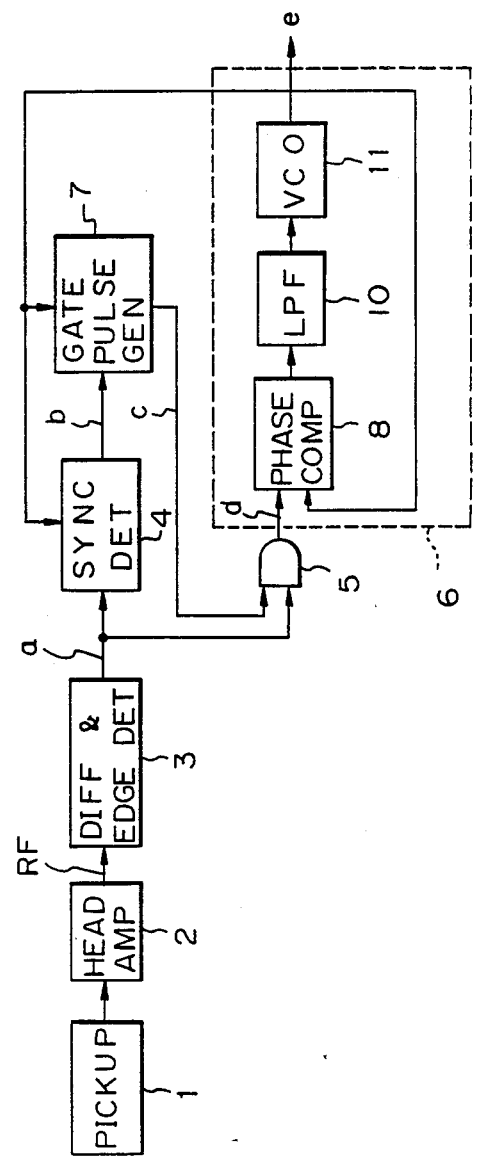
FIG. 2 is a block diagram of the optical disc recording and reproducing apparatus in which a conventional phase-locked loop circuit (PLL) is employed.
Figure 4A:
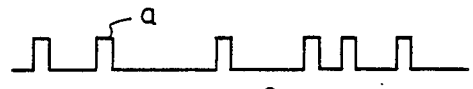
FIGS. 4A through 4C are operation timing charts of the optical disc recording and reproducing apparatus employing the conventional phase-locked loop circuit (PLL) shown in FIG. 2.
Figure 4B:
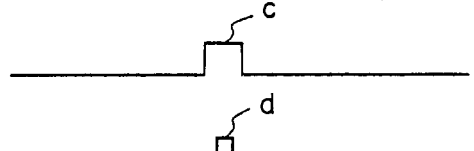
Figure 4C:
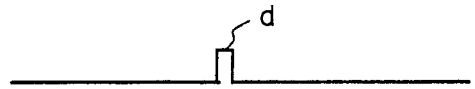
Figure 5:
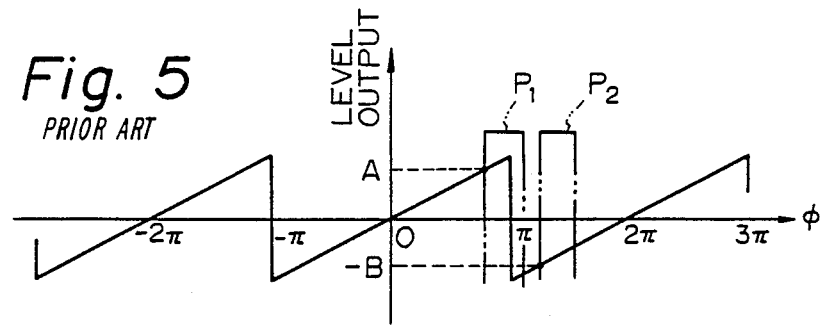
FIG. 5 is an operation chart of the phase comparator circuit 8 employed in the conventional phase-locked loop circuit (PLL) shown in FIG. 2.

Now, preferred embodiments of a phase-locked loop circuit (PLL) of the present invention will be hereinbelow described in detail with reference to the accompanying drawings. In the phase-locked loop circuit (PLL) shown in FIG. 8 which is a first embodiment of the present invention, the same circuit components as those employed in the conventional phase-locked loop circuit 6 shown in FIG. 2 will be denoted with the same reference numerals employed in the conventional circuit 6 shown in FIG. 2. Consequently, in order to eliminate redundancy in description, the same circuit components will not be described in detail hereinafter.

In general, the phase-locked loop circuit (PLL) incorporated in a disc player is so designed as to have loop constants which contribute to suppression of various jitter components within a predetermined ranges which jitter components are caused by a condition of the eccentricity of the disc. For example, a jitter "$\theta_e$" of the regenerated clock signal caused by the condition of the eccentricity of the disc can be represented by the following equation (1):

$$|\theta_e(t)|_{max} = (2\pi \cdot \omega_m \cdot F_{ck})/((\omega_n^2 - \omega_m^2) + (2\zeta \cdot \omega_n \cdot \omega_m)^2)^{\frac{1}{2}} \times (d_r/R) \quad (1)$$

wherein
$F_{ck}$ is a clock frequency,
$\omega_n$ is the so-called natural angular frequency (characteristic frequency) of the phase-locked loop circuit (PLL),
$\zeta$ is a damping factor of the PLL,
$\omega_m$ is the angular frequency of the optical disc,
$2d_r$ is an amount of the eccentricity of the optical disc, and
R is the scanning radius of the pickup device 1 on the disc.

In case that a target value of the residual jitter is about 1 nsec under a condition that: $\omega_m$ is 1800 rpm; $F_{ck}$ is 11.1456; and $2d_r$ is 80µ p-p, an actual value of the residual jitter is 1.01 nsec when $\omega_n$ is $2\pi \times 2.5$ KHz and $\zeta$ is 0.707. Consequently, in this case, it is possible to substantially suppress the residual jitter to the desired target value.

Figure 6:
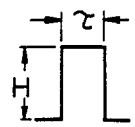
FIG. 6 is a view illustrating a phase error output pulse inputted to the phase-locked loop circuit (PLL) shown in FIG. 2.
Figure 7:
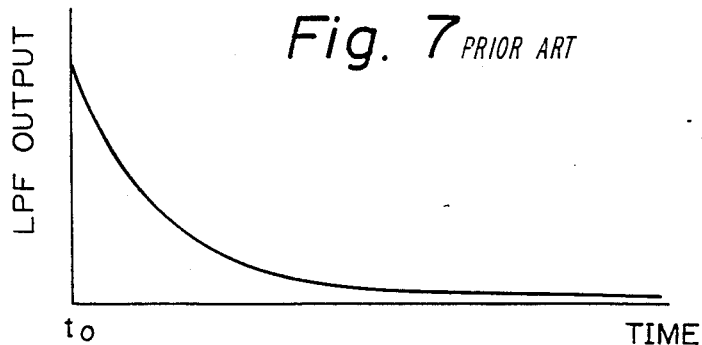
FIG. 7 is a graph illustrating an output characteristic of the low-pass filter circuit (LPF) 10 employed in the phase-locked loop circuit (PLL) shown in FIG. 2.

When a maximum phase error signal having a pulse width of "$\tau$" and an amplitude of "H" as shown in FIG. 6 is issued from a phase comparator circuit 8 to a low-pass filter circuit (LPF) 10 which largely contributes to the damping factor $\zeta$ of the PLL, the low-pass filter circuit (LPF) 10 issues a descending output signal with such a waveform as shown in FIG. 7. On the other hand, an amount of the frequency deviation of a voltage-controlled oscillator circuit (VCO) 11 corresponds to a product of the output signal of the low-pass filter circuit (LPF) 10 and a sensitivity $K_o$ of the voltage-controlled oscillator circuit (VCO) 11. The phase of a regenerative clock pulse "e", which is an output pulse issued from the voltage-controlled oscillator circuit (VCO) 11, relates to a time-integrated value of the output signal issued from the low-pass filter circuit (LPF) 10. In this connection, a product of a time-integrated value over one sampling domain of the output signal issued from the low-pass filter circuit (LPF) 10 and a value of $2\pi \times K_o$ corresponds to an amount of the phase variation of the regenerative clock pulse "e" in the next sampling point.

In case edge pulses "d", repeatedly appear at a central sampling frequency of $T_s$, the phase error "$\phi_e$" of the regenerative clock pulse "e" at the next sampling point can be represented by the following equation (2):

$$\phi_e = 2\pi \cdot \omega_n \cdot \zeta \cdot T_s + \pi \cdot \omega_n^2 \cdot T_s (T_s - \pi/2) \quad (2)$$

In the equation (2), since the second term is extremely smaller in amount than the first term, it is possible to neglect the second term of the equation (2) so that the phase error "$\phi_e$" of the regenerative clock pulse "e" at the next sampling point is substantially proportional to a product of the natural angular frequency $\omega_n$ of the phase-locked loop circuit (PLL) and its damping factor $\zeta$. In addition, it is also possible to convert the first term of the equation (2) into the following form;

$$\omega_n \cdot \zeta \mp \phi_e / 2\pi \cdot T_s$$

In order to limit the phase error "$\omega_e$" to a predetermined phase reference range $\pm \alpha$ of the phase comparator circuit 8, the following equation (3) must be satisfied:

$$|\omega_n \cdot \zeta| \leq |\alpha/2\pi \cdot T_s| \quad (3)$$

On the other hand, in order to limit the phase error "$\phi_e$" within a predetermined angular range $\pm \beta$ ($\beta < \alpha$) of the data-reading window, the following equation (4) must be satisfied:

$$|\omega_n \cdot \zeta| \leq |K \cdot \beta/2\pi \cdot T_s| \quad (4)$$

wherein
K is a safety coefficient determined upon consideration of characteristic of the jitter in the gate pulse system, Consequently, by setting the value of the product $\omega_n \cdot \zeta$ so as to satisfy the equation (3), it is possible to limit the phase error "$\phi_e$" within a predetermined phase reference range $\pm \alpha$ of the phase comparator circuit 8. In addition, it is also possible to limit the phase error "$\phi_e$" within a predetermined range $\pm \beta$ of the data-reading window by setting the product $\omega_n \cdot \zeta$ so as to satisfy the equation (4).

For example, in the phase-locked loop circuit (PLL) in which the target value of the jitter caused by the condition of eccentricity of the optical disc is limited to an amount of up to 1 nsec, the phase error "$\phi_e$" is approximately 0.7. However, in this case, when the data-reading window is in a range of $\pm \pi$, it is necessary to suppress the phase error "$\phi_e$" below $0.5\pi$ in order to stabilize the operation of the phase-locked loop circuit (PLL), to make it possible to limit the phase error "$\phi_e$" within the range $\pm \pi$ of the data-reading window even when extraneous electrical disturbances enter the phase-locked loop circuit (PLL).

Figure 8:
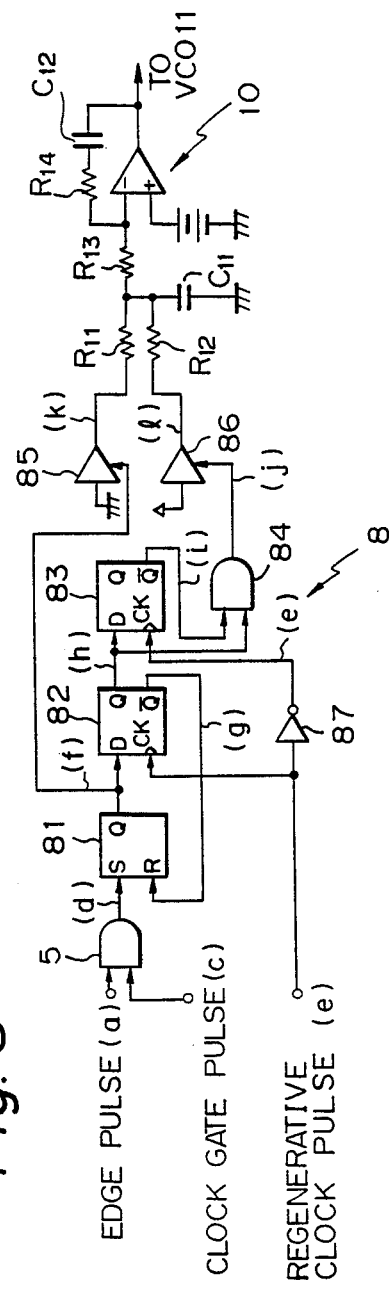
FIG. 8 is a circuit diagram of a first example of a phase comparator circuit according to the present invention.

FIG. 8 is a circuit diagram of a first embodiment of the phase-locked loop circuit (PLL) of the present invention having the above-mentioned loop constants. In FIG. 8, the reference numeral 81 denotes an R-S flip flop of the phase comparator circuit 8; The generative clock pulse "e" is supplied a D flip flop 82. An inverted regenerative clock pulse "ē" is supplied; to another D flip flop 83; An AND gate 84 produces a logical product of the Q output signal of the flip flop 82 and the $\overline{Q}$ output signal of the flip flop 83. A tri-state buffer 85 causes a capacitor $C_1$ of the low-pass filter circuit (LPF) 10 to discharge in response to the Q output signal issued from the flip flop 81, which filter circuit 10 is located downstream of the tri-state buffer 85. Another tri-state buffer 86 causes the capacitor $C_1$ to be charged in response to an output signal issued from the AND gate 84. An invertor 87 functions to invert the regenerative clock pulse "e" to produce the inverted regenerative clock pulse "ē". The flip flops 81, 82 and 83 are connected in cascade with each other so that the $\overline{Q}$ output signal issued form the flip flop 82 serves as a reset input signal supplied to the flip flop 81. Both of the tri-state buffers 85 and 86 form a so-called charge pump section for controlling the charging and discharging operation of the capacitor $C_1$ of the low-pass filter (LPF) 10.

For example, the low-pass filter (LPF) 10 is comprised of: resistors $R_{11}$, $R_{12}$, $R_{13}$ and $R_{14}$; capacitors $C_{11}$ and $C_{12}$; and an operational amplifier. The above-mentioned loop factors such as the damping factor $\zeta$ and the like can be determined by selecting the property of the low-pass filter (LPF) 10.

In an optical disc player employing the phase-locked loop circuit according to the present invention having the above construction, the RF signal decreases in level at areas in which the pits exist as shown in FIG. 9A when the optical spot beam emitted from the pickup device 1 scans the servo region on the optical disc. As a result, a differentiating and edge detector circuit 3 issues an edge pulse "a" as shown in FIG. 9B. When the interval of the edge pulse "a" reaches an amount corresponding to the above-mentioned distance "D" appearing in the focus area on the optical disc, the synchronization detector circuit 4 issues the synchronization-detecting signal "b" on the basis of which the gate pulse generator 7 issues the gate pulse "c" having such a waveform as shown in FIG. 9C, the gate pulse "c" being corresponding to the clock pit of the optical disc. Both of the edge pulse "a" and the gate pulse "c" are supplied to the AND gate 5 to enable the same to serve as the data-reading window, so that only the clock edge pulse "d" is separated and supplied to the flip flop 81 of the phase comparator circuit 8, which clock edge pulse "d" serves as a phase sampling pulse corresponding to the clock pit of the optical disc.

As a result, the flip flop 81 to which the clock edge pulse "d" has been supplied issues a Q output signal "f" to both of the buffer 85 and the flip flop 82, which clock edge pulse "d" is high in level as shown in FIG. 9E. On the other hand, at the leading edge of the regenerative clock pulse "e" supplied to the $C_k$ input terminal of the flip flop 82, the flip flop 82 issues a $\overline{Q}$ output signal having a high level to the flip flop 81 to reset the same so that the Q output signal "f" of the flip flop 81 decreases in level. Consequently, the pulse width of the Q output signal "f" of the flip flop 81 represents a phase difference between the edge pulse "d" and the regenerative clock pulse "e".

When the Q output signal "f" issued from the flip flop 81 increases in level, the buffer 85 issues a low-level output signal "k" as shown in FIG. 9M to cause the capacitor $C_1$ to discharge. On the other hand, at this time, the output signal "j" issued from the AND gate 84 and having such a waveform as shown in FIG. 9L corresponds in timing to a half of the cycle of the regenerative clock pulse "e" to cause the buffer 86 to issue a high-level output signal "1" as shown in FIG. 9N to the capacitor $C_1$ to charge the same. Although it is possible to employ only the Q output signal "f" issued from the flip flop 81 as a phase reference signal, in the embodiment of the phase-locked lop circuit of the present invention, the output signal issued from the AND gate 84 is also employed together with the above Q output signal "f" issued from the flip flop 81 to realize a differential use thereof to make it possible to reduce the variation in cycle of the regenerative clock pulse "e". The phase difference component is smoothed by the low-pass filter (LPF) 10 and then supplied to the voltage-controlled oscillator (VCO) 11.

As a result, the regenerative clock pulse "e" having a frequency of for example 11.1456 KHz is issued from the phase-locked loop circuit 6 according to the present invention.

It should be understood the phase comparator circuit 8 may be so modified as to start counting of the number of the pulse at the leading edge of the edge pulse "d" and to stop such counting at the leading edge of the regenerative clock pulse "e", so that the output signal derived from such counting serves as a phase difference output signal.

Figure 10:
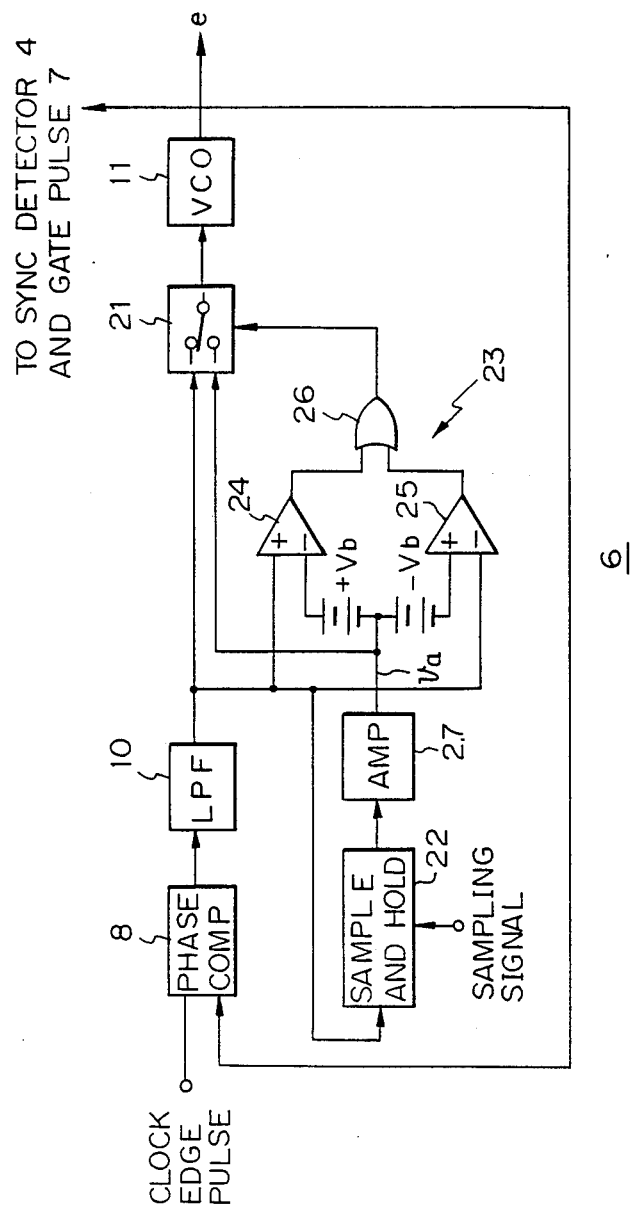
FIG. 10 is a circuit diagram showing phase-locked loop circuit (PLL) according to the present invention.

FIG. 10 shows a second embodiment of the phase-locked loop circuit (PLL) of the present invention. In the phase-locked loop circuit (PLL) 6 of the present invention shown in FIG. 10, when a large extraneous electrical disturbance enters the voltage controlled oscillator (VCO) 10 of the PLL 6 or the phase errors tends to occur therein, it is possible to stabilize in operation the phase-locked loop circuit (PLL) 6 by substantially controlling in the natural angular frequency $\omega_n$ and the damping factor $\zeta$ of the PLL 6. In the phase-locked loop circuit (PLL) 6 shown in FIG. 10, the same circuit components as those employed in the conventional phase-locked loop circuit (PLL) 6 shown in FIG. 2 will be denoted with the same reference numerals employed in the conventional PLL 6 shown in FIG. 2. Consequently, in order to eliminate redundancy in description, such circuit components will not be described hereinafter.

As shown in FIG. 10, an output signal issued from the low-pass filter (LPF) 10 is supplied to the voltage-controlled oscillator (VCO) 11 through one of a pair of input terminals of a signal-selection switch 21. In addition, the output signal issued form the low-pass filter (LPF) 10 is also supplied to a sample and hold circuit 22 and a window comparator circuit 23 which is comprised of: a pair of comparators 24 and 25; and an OR gate 26 through which the high-level output signals of these comparators 24 and 25 are supplied to the control input terminal of the signal-selection switch 21. In the sample and hold circuit 22, sampling of the output signal issued from the low-pass filter circuit (LPF) 10 is conducted in response to the sampling signal issued from the sampling signal generator circuit (not shown). The thus sampled output signal is kept in the sample and hold circuit 22 for the period of one sampling cycle. For example, the sampling signal is produced when the pickup device 1 scans the mirror area between the wobble pit and clock pit of the servo area. For example, an example of such sampling signal generator circuit is disclosed in Japanese Patent Application No. 61-198531.

The output signal issued from the sample and hold circuit 22 reaches in voltage a value of "$v_a$" at a downstream position of a buffer amplifier 27, and is supplied to the other of the pair of the input terminals of the signal-selection switch 21. In addition, the output signal having the value "$v_a$" is also coupled with an output signal having a voltage of "$\pm v_b$" issued from a voltage source shown in FIG. 10, and thereafter supplied to a reference standard input terminal of each of the comparators 24 and 25. Consequently, to the reference standard input terminal of the comparator 24 is applied a voltage of "$v_a+v_b$" volts. On the other hand, to the reference standard input terminal of the comparator 25 is applied a voltage of "$v_a-v_b$" volts. The window comparator circuit 23 issues a high-level output signal when the output signal issued form the low-pass filter circuit (LPF) 10 exceeds in voltage the value of "$v_a+v_b$" or "$v_a-v_b$". The remaining construction of the phase-locked loop circuit (PLL) 6 of FIG. 10 is the same as that of the conventional phase-locked loop circuit (PLL) 6 shown in FIG. 2.

In the phase-locked loop circuit (PLL) 6 of the present invention shown in FIG. 10 when the phase error signal is issued form the phase comparator circuit 8 to the low-pass filter circuit (LPF) 10 at a time of "$t_o$", the output signal issued from the LPF 10 increases in level as shown in FIG. 12A. In case that the level of the output signal in voltage issued from the LPF 10 is relatively low as shown in FIG. 12A, such level does not exceed a threshold value of "$v_a+v_b$" volts of the window comparator circuit 23. Consequently, in this case, as shown in FIG. 12B, the switch 21 selects the output signal of the LPF 10 and relates it to the voltage-controlled oscillator circuit (VCO) 11.

In case that the output signal issued from the LPF 10 is considerably large in amplitude as shown in FIG. 12C, the output signal issued from the window comparator circuit 23 becomes large in level when the output signal issued from the LPF 10 exceeds the threshold value at a time of "$t_1$", to decrease the level of the output signal issued from the LPF 10. As a result, the switch 21 selects the output signal of "$v_a$" issued from the buffer amplifier 27 until the output signal issued from the LPF 10 becomes lower than the above threshold value.

Under such circumstances, the output signal of the switch 21, which is identical with an input signal of the voltage-controlled oscillator circuit (VCO) 11, remains in level at the voltage "$v_a$" of the previously sampled output signal of the buffer amplifier 27 during a period of time between "$t_1$" and "$t_2$" as shown in FIG. 12D. Otherwise, the switch 21 selects the output signal issued from the LPF 10.

Variation in phase of the regenerative clock pulse "e" issued from the voltage-controlled oscillator circuit (VCO) 11 is proportional to areas of a triangular wave section shown in FIG. 12B and a triangular wave section and a spike-shaped wave section shown in FIG. 12D. Consequently, it is possible to decrease the phase deviation of the regenerative clock pulse "e" at the sampling point by an amount corresponding to a reduced areas of the above sections, which areas are reduced through the operation of the window comparator circuit 23.

In other words, through the above construction of the phase-locked loop circuit 6 of the present invention, in effect, both of the natural angular frequency $\omega_n$ and the damping factor $\zeta$ both appearing in the above equation (2) are temporarily set at low levels.

Figure 11:
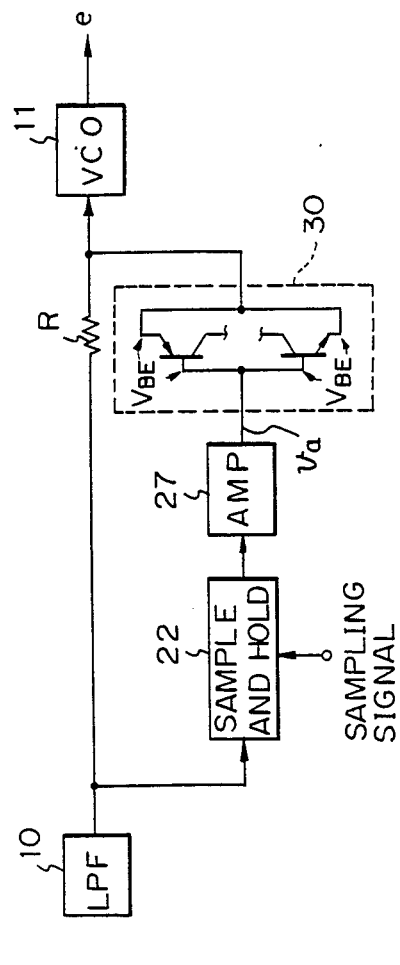
FIG. 11 is a circuit diagram showing in a modified one of the phase-locked loop circuit shown in FIG. 10.

FIG. 11 is a circuit diagram of a modified example of the second embodiment of the present invention shown in FIG. 10. As shown in FIG. 11, in the modified example of the second embodiment of the present invention, a circuit consisting of a resistor R and a transistor limiter circuit 30 corresponds in function to a circuit consisting of the switch 21 and the window comparator circuit 23 employed in the second embodiment of the present invention shown in FIG. 10. The remaining circuit construction of the modified example of the second embodiment of the present invention shown in FIG. 11 is the same as that of the second embodiment of the present invention shown in FIG. 10 having been already described and, therefore, is not described again in order to eliminate redundancy in description.

As shown in FIG. 11, in the modified example of the second embodiment of the phase-locked loop circuit (PLL) of the present invention, the output signal issued from the low-pass filter circuit (LPF) 10 is supplied to the control input terminal of the voltage-controlled oscillator circuit (VCO) 11. In addition, the output signal issued from the low-pass filter circuit (LPF) 10 is also supplied to the sample and hold circuit 22 to cause the same to hold the output signal of the LPF 10 in response to the above-mentioned sampling signal. On the other hand, the output signal issued from the sample and hold circuit 22 is supplied to the transistor limiter circuit 30 through the buffer amplifier 27. The transistor limiter circuit 30 is constructed of a PNP transistor and a NPN transistor a base and an emitter of which are connected with a base and an emitter of the PNP transistor, respectively. An output signal terminal of the transistor limiter circuit 30 is connected to a control input terminal of the voltage-controlled oscillator circuit (VCO) 11. The transistor limiter circuit 30 controls in voltage the input signal supplied to the control input terminal of the voltage-controlled oscillator circuit (VCO) 11 so as to limit in voltage such input signal to the voltage "$V_a+V_b$" or the voltage "$V_a-V_b$". The remaining construction of the modified example of the second embodiment of the present invention shown in FIG. 11 is the same as that of the second embodiment of the present invention shown in FIG. 10.

FIG. 12E is a graph illustrating an input characteristic of the transistor limiter circuit 30. In the circuit shown in FIG. 11, when an input signal or VCO input signal which has its voltage varied as shown in the wave-shaped graph in broken line in FIG. 12E is supplied to the voltage-controlled oscillator circuit (VCO) 11 under a condition that the voltage of the VCO input signal is lower than the threshold value, the transistor limiter circuit 30 issues an output signal which has the threshold value of "$V_a-V_{BE}$" serving as a control voltage for the voltage-controlled oscillator circuit (VCO) 11. As a result, the VCO input signal supplied to the VCO 11 having a low level increases and exceeds the threshold value of "$V_a-V_{BE}$" at a time of "$t_o$" as shown in FIG. 12E, and thereafter serves as the control voltage for the voltage-controlled oscillator circuit (VCO) 11. Then, as is clear from the graph shown in FIG. 12E, when the voltage of the VCO input signal exceeds the threshold value of "$V_a+V_{BE}$" at a time of "$t_1$", the transistor limiter circuit 30 limits the voltage of the VCO input signal to the threshold value of "$V_a+V_{BE}$". Thereafter, when the voltage of the VCO input signal decreases to a value lower than the threshold value of "$V_a+V_{BE}$" at a time of "$t_2$", the transistor limiter circuit 30 stops its operation. As a result, the voltage of the VCO input signal varies to present the wave-shaped graph shown in a solid line in FIG. 12E.

When, as described above, the voltage of the VCO input signal exceeds a threshold value determined on the basis of the level of the voltage which the sample and hold circuit 22 holds, the transistor limiter circuit 30 controls the voltage of the VCO input signal so as to prevent the same from excessively increasing. As a result, even when a fault of the clock pit is found in the optical disc, the extraneous electrical disturbance caused by such fault of the clock pit is rapidly suppressed or solved during a single sampling cycle thereby to prevent the error signal from being transferred to the next sampling cycle.

It should be appreciated that the extraneous electrical disturbance can be detected by the use of various kinds of detecting means so as to control the switch 21 on the basis of the thus detected extraneous electrical disturbance. For example, it may be possible to replace by a suitable digital circuit any of the phase comparator circuit 8, low-pass filter circuit (LPF) 10, sample and hold circuit 22, buffer amplifier 27, window comparator circuit 23 and the transistor limiter circuit 30.

As described above, in the phase-locked loop circuit (PLL of the first embodiment of the present invention shown in FIG. 8, both of the natural angular frequency and the damping factor of the PLL are so determined as to limit the phase error within the linear range of the phase comparator circuit even when the extraneous electrical disturbance enters the PLL, it is possible to suppress adverse influence by the extraneous electrical disturbance to the PLL.

On the other hand, in the phase-locked loop circuit (PLL) of the second embodiment of the present invention shown in FIG. 10, the level of the clock control signal is limited to the predetermined value in the PLL in case that the level of the clock control signal supplied to the various frequency oscillator circuit for varying the clock signal in its frequency and phase exceeds the predetermined value, so that the phase deviation of the output signal issued from the voltage-controlled oscillator circuit (PLL) is suppressed to a small amount whereby the output signal of the phase difference is prevented from having any discontinuity even when the extraneous electrical disturbance having a relatively large level enters the PLL.

What is claimed is:

1. A recording medium drive apparatus which drives a recording medium on which clock marks are recorded to produce a read signal having a period which may vary about a clock period $T_s$, comprising:
   a phase-locked loop (PLL) circuit for producing a clock signal comprising:
      phase comparator means having a linear characteristic range of $\pm \alpha$, wherein said phase comparator means produces a clock control signal having a magnitude which varies depending upon a phase difference between the clock signal and the read signal; and
      variable frequency oscillator means for generating the clock signal so that the frequency of said clock signal varies in response to the magnitude of said clock control signal;
   wherein the following relation stands:

$$|\omega_n \cdot \zeta| \leq |\alpha/2\pi \cdot T_s|$$

where $\omega_2$ and $\zeta$ are the natural angular frequency and the damping factor of the PLL loop, respectively.

2. The recording medium drive apparatus as set forth in claim 1, wherein said clock signal serves as a data reading clock signal in a data signal receiving circuit with a data signal reading window of a window width of an angular range $\beta$, and wherein the following relations stand:

$$\beta \leq \alpha;$$

and $$|\omega_n \cdot \zeta| \leq |K \cdot \beta/2\pi \cdot T_s|$$

wherein $0 < K < 1$.

3. A recording medium drive apparatus which drives a recording medium on which clock marks are recorded to produce a read signal having a period which may vary about a clock period $T_s$, comprising:
   a phase-locked loop (PLL) circuit for producing a clock signal comprising:
      phase comparator means having a linear characteristic range, wherein said phase comparator means produces a clock control signal having a magnitude which varies depending upon a phase difference between the clock signal and the read signal;
      variable frequency oscillator means for generating the clock signal so that the frequency of said clock signal varies in response to the magnitude of said clock control signal; and
   level limiter means for preventing the magnitude of said clock control signal from exceeding a predetermined value.

4. The recording medium drive apparatus as set forth in claim 3, wherein said level limiter means comprises an amplitude limiter means.

5. A recording medium drive apparatus which drives a recording medium on which clock marks are recorded to produce a read signal having a period which may vary about a clock period $T_s$, comprising:
   a phase-locked loop (PLL) circuit for producing a clock signal comprising:
      phase comparator means having a linear characteristic range, wherein said phase comparator means produces a clock control signal having a magnitude which varies depending upon a phase difference between the clock signal and the read signal;
      variable frequency oscillator means for generating the clock signal so that the frequency of said clock signal varies in response to the magnitude of said clock control signal; and level limiter means for preventing the magnitude of said clock control signal from exceeding a predetermined value;
   wherein said level limiter means comprises:
   sample and hold means for sampling the magnitude of said clock control signal at a predetermined sampling frequency to produce a sample value; and
   level control means for decreasing the magnitude of said clock control signal when the magnitude of said clock control signal reaches a value larger than said sample value by a predetermined reference amount.

* * * * *